(12) United States Patent
Thrue

(10) Patent No.: US 12,742,440 B2
(45) Date of Patent: Sep. 22, 2026

(54) METHOD FOR TESTING A LIGHTNING PROTECTION SYSTEM AND/OR A LIGHTNING DETECTION SYSTEM OF A WIND TURBINE

(71) Applicant: Siemens Gamesa Renewable Energy A/S, Brande (DK)

(72) Inventor: Carsten Thrue, Braedstrup (DK)

(73) Assignee: SIEMENS GAMESA RENEWABLE ENERGY A/S, Brande (DK)

( * ) Notice: Subject to any disclaimer, the term of this patent is extended or adjusted under 35 U.S.C. 154(b) by 260 days.

(21) Appl. No.: 17/802,184

(22) PCT Filed: Dec. 22, 2020

(86) PCT No.: PCT/EP2020/087559
§ 371 (c)(1),
(2) Date: Aug. 25, 2022

(87) PCT Pub. No.: WO2021/175483
PCT Pub. Date: Sep. 10, 2021

(65) Prior Publication Data
US 2023/0358212 A1 Nov. 9, 2023

(30) Foreign Application Priority Data
Mar. 6, 2020 (EP) .................................... 20161403

(51) Int. Cl.
*F03D 17/00* (2016.01)
*F03D 80/30* (2016.01)
(Continued)

(52) U.S. Cl.
CPC .......... *F03D 17/002* (2023.08); *F03D 80/30* (2016.05); *B64U 10/14* (2023.01);
(Continued)

(58) Field of Classification Search
CPC ................................ F03D 17/00; F03D 80/30
See application file for complete search history.

(56) References Cited

U.S. PATENT DOCUMENTS 8,888,454 B2 * 11/2014 Hansen .................. F03D 80/30
415/908
10,401,414 B2 * 9/2019 Matsushita ........... G01R 31/52
(Continued)

FOREIGN PATENT DOCUMENTS

CN 206515388 U * 9/2017
DE 20 2014 006541 U1 11/2015
(Continued)

OTHER PUBLICATIONS

Espacenet translation of JP 2017166382 A (Year: 2021).*
(Continued)

*Primary Examiner* — Christopher R Legendre
(74) *Attorney, Agent, or Firm* — Schmeiser Olsen PLLC

(57) ABSTRACT

A method for testing a lightning protection system and/or a lightning detection system of a wind turbine is provided, the method including usage of an unmanned aerial vehicle including an electrical impulse generator capable to simulate a lightning strike by discharging an electrical impulse, whereby the method includes the steps of: (a) maneuvering the unmanned aerial vehicle with the electrical impulse generator contacting the wind turbine or with the electrical impulse generator being within a range of the electrical impulse generator to the wind turbine such that the electrical impulse discharged by the electrical impulse generator will impact the wind turbine, and (b) discharging the electrical impulse by the electrical impulse generator such that the discharged electrical impulse impacts the wind turbine as an impacting electrical impulse.

14 Claims, 1 Drawing Sheet

(51) Int. Cl.

| | |
|---|---|
| *B64U 10/14* | (2023.01) |
| *B64U 101/26* | (2023.01) |
| *B64U 101/30* | (2023.01) |
| *G01R 15/18* | (2006.01) |

(52) U.S. Cl.
CPC ...... *B64U 2101/26* (2023.01); *B64U 2101/30* (2023.01); *F05B 2260/83* (2013.01); *G01R 15/181* (2013.01)

(56) References Cited

U.S. PATENT DOCUMENTS

| | | | | |
|---|---|---|---|---|
| 10,859,346 | B2 * | 12/2020 | Townsend | F41G 5/18 |
| 2016/0047850 | A1 * | 2/2016 | Bruins | F03D 80/00 324/715 |
| 2019/0178230 | A1 * | 6/2019 | Sulzer | F03D 17/00 |
| 2021/0140409 | A1 * | 5/2021 | Schlüter | F03D 17/00 |
| 2023/0358212 | A1 * | 11/2023 | Thrue | G01R 15/181 |

FOREIGN PATENT DOCUMENTS

| | | | |
|---|---|---|---|
| EP | 3 211 226 | A1 | 8/2017 |
| EP | 3 495 655 | A1 | 6/2019 |
| JP | 2017 166382 | A | 9/2017 |

OTHER PUBLICATIONS

Print-out of https://www.sinteredfilter.net/does-tungsten-rust/ (Year: 2025).*

International Search Report and Written Opinion for PCT/EP2020/087559, issued on Mar. 25, 2021.

* cited by examiner

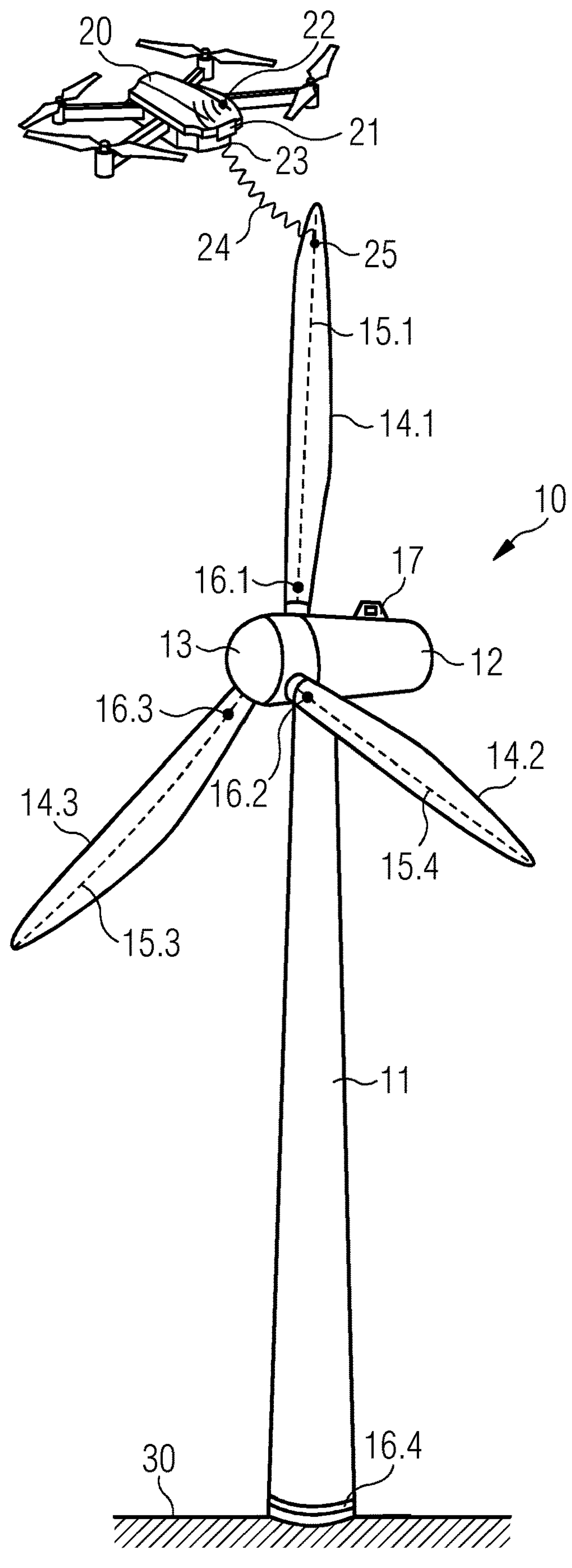
20
22
21
23
24
25
15.1
14.1
10
17
16.1
13
12
16.3
14.2
16.2
14.3
15.4
15.3
11
30
16.4

METHOD FOR TESTING A LIGHTNING PROTECTION SYSTEM AND/OR A LIGHTNING DETECTION SYSTEM OF A WIND TURBINE

CROSS-REFERENCE TO RELATED APPLICATIONS

This application claims priority to PCT Application No. PCT/EP2020/087559, having a filing date of Dec. 22, 2020, which claims priority to EP Application No. 20161403.9, having a filing date of Mar. 6, 2020, the entire contents both of which are hereby incorporated by reference.

FIELD OF TECHNOLOGY

The following relates to a method for testing a lightning protection system and/or a lightning detection system of a wind turbine.

BACKGROUND

Lightnings are likely to strike wind turbines due to their exposed location and height. As lightning strikes may cause considerable damage to a wind turbine, wind turbines are typically protected by a lightning protection system. The objective of the lightning protection system is to prevent lightning from damaging the blades, bearings and electrical systems of the wind turbine when the wind turbine intercepts a lightning strike.

In particular, the blades of the wind turbines are susceptible to both, interception of lightning strikes when they are at a pointer position of or near 12 o clock, i.e., showing up to the sky, and taking severe damage from lightning strikes. For this purpose, the blades are provided with down conductors extending from their tip to the hub to which they are attached to as part of the lightning protection system. The lightning protection system further comprises lightning conductors running from the hub via the nacelle down to the tower acting as a further down conductor to earth or having conductors inside or outside of the tower and being grounded.

In addition to the lightning protection system, wind turbines may comprise a lightning detection system. The lightning detection system is able to detect lightning strikes intercepted by the wind turbine by detecting electric energy flow from the lightning strike in the down conductors of the lightning protection system. The lightning detection system thereby informs the operator of the wind turbine about an intercepted lightning strike. When the lightning detection system detected a lightning strike or a number of lightning strikes, the wind turbine may be visually inspected for damage caused by the intercepted lightning strikes. Thereby it may be prevented that a damaged wind turbine is operated, which may possibly result in larger damage of the wind turbine.

A wind turbine with its lightning protection system and its lightning detection system is very cost-intensive in manufacture and installation. Thus, when the lightning protection system or the lightning detection system fails, the economic damage is very high. Still, currently a reliable, inexpensive and simple method for testing the lightning protection system or the lightning detection system of the wind turbine is not available.

Of course, it is possible to test the components such as the down conductors of the lightning protection system and the components of the lightning detection system separately and prior to installing them in the wind turbine. However, such a method is not reliable because it does not guarantee that the lightning protection system and the lightning detection system are assembled correctly within the wind turbine and will work as required in the field compared to theory when a lightning strikes the wind turbine.

Also, of course, it may be possible to manually simulate lightning strikes by injecting electric energy at certain components and positions at the wind turbine. However, due to the size and height of the wind turbine such a method is very impractical, expensive and difficult to perform.

SUMMARY

An aspect relates to a simple, reliable and inexpensive method for testing a lightning protection system and/or a lightning detection system of a wind turbine.

According to a first aspect of embodiments of the invention, the object is solved by a method for testing a lightning protection system and/or a lightning detection system of a wind turbine, the method comprising usage of an unmanned aerial vehicle comprising an electrical impulse generator capable to simulate a lightning strike by discharging an electrical impulse, whereby the method comprises the steps of:

(a) maneuvering the unmanned aerial vehicle with the electrical impulse generator contacting the wind turbine or with the electrical impulse generator being within a range of the electrical impulse generator to the wind turbine such that the electrical impulse discharged by the electrical impulse generator will impact the wind turbine, and (b) discharging the electrical impulse by the electrical impulse generator such that the discharged electrical impulse impacts the wind turbine as an impacting electrical impulse.

The method according to embodiments of the invention utilizes an unmanned aerial vehicle, commonly referred to as a drone, equipped with an electrical impulse generator to simulate a lightning strike intercepted by the wind turbine. Due to the high maneuverability of the unmanned aerial vehicle, the electrical impulse may be discharged at any portion or component, such as the blade, of the wind turbine in a simple and fast manner. In particular, the electrical impulse is discharged so as to impact the lightning protection system, in particular its down conductor. Thereby, when the discharged electrical impulse impacts the wind turbine as impacting electrical impulse, the impacting electrical impulse is intercepted by the lightning protection system. The impacting electrical impulse than flows through the lightning protection system, i.e., its down conductors, as electrical energy. In other words, the discharged electric impulse impacts the wind turbine and flows through the wind turbine, in particular its lightning protection system, as electrical energy. The words impacting electrical impulse and electrical energy may thus be used alternatively or synonymously. The impacting electric impulse or electrical energy is detectable by the lightning protection system. The impacting electric impulse or electrical energy may be measurable by the lightning detection system. For example, the amount of electrical energy may be measured in Watts. The method further benefits from the low costs of the unmanned aerial vehicle. The method is very reliable because it actually allows for field testing of the functionality of the lightning protection system and/or the lightning detection system wind turbine rather than prior to their installment in the wind turbine.

For testing the functionality of the lightning protection system of the wind turbine, when the discharged electrical impulse simulating the lightning strike has impacted the wind turbine and flows as impacting electrical impulse or electrical energy through the lightning protection system, i.e., it's down conductors, the wind turbine may afterwards be visually inspected whether or not the wind turbine has taken damage or the impacting electrical impulse or electrical energy has been properly forwarded by the lightning protection system to the ground on which the wind turbine is installed.

To test the functionality of the lightning detection system of the wind turbine, it may simply be checked whether or not the lightning detection system has detected the impacting electrical impulse or electrical energy not. This may be checked manually or automatically with the electrical impulse generator being linked, for example via a wireless connection, to the lightning detection system.

Although the flying time of the unmanned aerial vehicle is typically limited due to its size and energy source, such as a battery or a fuel cell, the flying time is sufficient to perform the method of embodiments of the invention various times. Further, the energy source of the unmanned aerial vehicle may be used for generating the electrical impulse to be discharged or the unmanned aerial vehicle, in particular the electrical impulse generator, may be provided with an additional energy source.

The unmanned aerial vehicle may be part of an unmanned aircraft system including the unmanned aerial vehicle, a ground-based controller and a communication system between the two. The flight of the unmanned aerial vehicle may operate with various degrees of autonomy, either under remote control by a human operator or autonomously by an onboard computer. The onboard computer may be a supervisory control and data acquisition system of the wind turbine. The unmanned aerial vehicle may be of any type. For example, the unmanned aerial vehicle may be a quadcopter.

In an embodiment, the electrical impulse generator comprises at least one electrode being fired from the unmanned aerial vehicle to impact the wind turbine, whereby the at least one electrode is electrically connected to the electrical impulse generator after firing for discharging the electrical impulse. The at least one electrode may be electrically connected to the electrical impulse generator by a wire, for example. The range of the electrical impulse generator is than limited to the length of the wire. Further, the electrical impulse generator may be provided with more than one electrode, for example two or more electrodes. Such principle is known from electroshock weapons, in particular tasers, which are widely available and low costs. In this case, it is not necessary to bring the electrical impulse generator into contact with the wind turbine but only in close proximity such that it is less than or exactly the range between the electrical impulse generator and it's at least one electrode when fired. However, it may also be possible that the electrical impulse generator is arranged to create an electric arc, in particular in between two electrodes of the electrical impulse generator or in between one electrode of the electrical impulse generator and the wind turbine itself, in which case the unmanned aerial vehicle needs to be brought closer to the wind turbine or to contact it. Further, it may be possible that the electrical impulse generator is or comprises a laser. The laser may be an electro laser. The laser may be configured to fire the electrical impulse, in particular to form an electrically conductive laser-induced plasma channel impacting on the wind turbine.

In an embodiment the unmanned aerial vehicle comprises a camera for inspecting the wind turbine for damages. Thereby, by the unmanned aerial vehicle, the method may not only be used for testing the lightning protection system and/or the lightning detection system but also for inspecting the wind turbine for damage due to the discharged electrical impulse or earlier lightning strikes. For this purpose, the method may further comprise the step of inspecting the wind turbine, in particular the portion or component, such as a blade, of the wind turbine that has been impacted by the discharged electrical impulse or a lightning strike. The camera may be arranged so as to take photos or videos of this portion or component of the wind turbine. Thereby, visual inspection may be provided. Alternatively, or further, the camera may also be provided as a thermographic camera to inspect the wind turbine for damages.

In an embodiment, the lightning detection system comprises at least one detection point at which the lightning detection system detects the impacting electrical impulse. It is desired that the lightning detection system comprises multiple detection points located at different portions and/or components, in particular blades, of the wind turbine blade. Thereby, it may be detected where, i.e., in which down conductors, the impacting electrical impulse or electrical energy flows.

In an embodiment, the at least one detection point of the lightning detection system is located inside of a blade of the wind turbine, inside of a hub of the wind turbine, inside a nacelle of the wind turbine and/or at a tower of the wind turbine. In particular, multiple detection points may be located in each of the aforementioned components of the wind turbine. Thereby, it may be detected in which different components of the wind turbine the impacting electrical impulse or electrical energy flows.

In an embodiment, when impacting electrical impulse is not detected by the lightning detection system at the at least one detection point at the tower of the wind turbine after discharged electrical impulse has impacted the wind turbine, it is judged, that the lightning protection system has a malfunction. This judgement can be made due to the impacting electrical impulse or electrical energy not being transferred via the lightning protection system to the detection point at the tower of the wind turbine. This means, that the lightning protection system did not transfer the impacting electrical impulse or electrical energy to the ground and therefore must have some malfunction. If such judgement is made, the method may further comprise, that the lightning protection system is inspected for its malfunction.

In an embodiment, the at least one detection point is a measurement point for measuring the impacting electrical impulse. Compared to a detection point at the measurement point, the lightning detection system having the measurement point is not only able to detect the impacting electrical impulse or electrical energy but also to measure it. In particular, the lightning detection system may be arranged to measure the form (i.e., direct or alternating current), magnitude of the electrical impulse or electrical energy, i.e., in Watts, and/or the duration of electrical impulse or electrical energy flow. For this purpose, the lightning detection system may comprise an ohmmeter. In particular, the at least one measurement point may comprise the ohmmeter.

In an embodiment, the at least one measurement point is formed by or comprises a Rogowski coil. The Rogowski coil is an electrical device for measuring alternating current or electrical impulses. The Rogowski coil may comprise a helical coil of a wire with a lead from one end returning through a center of the coil to the other end, so that both terminals are at the same end of the coil. The Rogowski coil may be wrapped around the down conductor of the lightning detection system to measure the impacting electrical impulse or electrical energy flowing through the down conductor.

In an embodiment, the method further comprises the steps of: (a) measuring the impacting electrical impulse at the at least one measurement point, and (b) comparing the impacting electrical impulse with the discharged electrical impulse. Thereby, when comparing the impacting electrical impulse or electrical energy injected into the wind turbine, in particular it's lightning protection system, with the discharged electrical impulse it may be assessed whether the lightning detection system correctly detects the discharged electrical impulse or electrical energy introduced into the lightning protection system, i.e., its conductors, or not. If the measured impacting electrical impulse or electrical energy and the known discharged electrical impulse do not match, it may be judged that the lightning detection system does not work properly.

In an embodiment, the unmanned aerial vehicle comprises a first interface connected or connectable to an analysis unit and the lightning detection system comprises a second interface connected or connectable to the analysis unit, whereby the analysis unit is arranged for comparing the impacting electrical impulse with the discharged electrical impulse. The analysis unit may be provided separate from the unmanned aerial vehicle and the wind turbine or as part of the wind turbine, for example. In particular, the analysis unit may be integrated into a supervisory control and data acquisition system of the wind turbine. The supervisory control and data acquisition may be arranged to also control the lightning protection system and/or the lightning detection system. The first interface and/or the second interface may be wireless interfaces, for example. Thereby, in the analysis, the comparison of the impacting electrical impulse or electrical energy and the discharged electrical impulse may be performed automatically, and no manual comparison needs to be performed. The analysis unit may also judge whether the lightning protection system and/or the lightning detection system work properly or have a malfunction and send out an alarm or warning, if a malfunction is detected.

In an embodiment, the duration and/or magnitude of the discharged electrical impulse is predetermined, the duration and/or magnitude of the impacting electrical impulse is measured at the at least one measurement point and the duration and/or magnitude of the discharged electrical impulse and the impacting electrical impulse are compared. In particular, the duration and/or magnitude of the discharged electrical impulse or electrical energy may be adjustable by the electrical impulse generator and thus be predetermined as required. Thereby, when the duration and/or magnitude of the compared currents do not match or deviate by a predetermined margin, it may be judged, that a malfunction occurs in the lightning detection system because the discharged electrical impulse or electrical energy introduced into the wind turbine is not properly detected and measured by the lightning detection system.

In an embodiment, when the impacting electrical impulse is detected at a measurement point at a tower of the wind turbine and the discharged electrical impulse and the measured impacting electrical impulse are different from one another in at least one of the at least one measurement points, it is judged, that the lightning detection system has a malfunction. This judgement can be made because when the impacting electrical impulse or electrical energy has been transferred to the tower, this means, that the lightning protection system functions properly. But when the comparison in the measured impacting electrical impulse and the actually discharged electrical impulse shows a deviation, in particular in duration and/or magnitude of the electrical impulses, the lightning detection system must have a malfunction. In particular, it may be required that the discharged electrical impulse and the measured impacting electrical impulse are different from one another by a predetermined margin. The predetermined margin may be selected as required to account for measurement inaccuracies and/or loss of electrical impulse due to effects in the lightning protection system. Thereby, false results may be prevented. When this occurs, the lightning detection system, in particular with its measurement points, in particular with their ohmmeters and Rogowski coils, may be visually and/or electrically inspected to detect the source of the malfunction and repair the lightning detection system.

In an embodiment, the electrical impulse is discharged by the electrical impulse generator on a blade, in particular on a tip section of the blade, of the wind turbine. Further in particular, the electric impulse may be discharged on a lightning receptor, which may be formed as a lightning receptor cap, at the tip section. This ensures that the down conductor in the blade is tested in its entire length, i.e., from its tip to the hub to which it is attached. Further, the blade is the component of the wind turbine being most susceptible and sensitive to lightning strikes.

In an embodiment, the discharging of the electrical impulse by the electrical impulse generator is performed several times and at different positions and/or blades of the wind turbine. Thereby, the lightning detection system and/or the lightning protection system of the wind turbine may be tested comprehensively.

In an embodiment, the discharging of the electrical impulse by the electrical impulse generator is performed several times at different form, duration and/or magnitude of the discharged electrical impulse. Thereby, the lightning detection system and/or the lightning protection system of the wind turbine may be tested comprehensively.

BRIEF DESCRIPTION

Some of the embodiments will be described in detail, with reference to the following figures, wherein like designations denote like members, wherein:

FIG. 1 shows a side perspective view on a wind turbine 10 being tested according to the method by an unmanned aerial vehicle 20. For visualization purposes only, the unmanned aerial vehicle 20 is scaled up compared to the wind turbine 10.

DETAILED DESCRIPTION

The wind turbine 10 comprises a tower 11 and a nacelle 12 resting on top of the tower 11. The tower 11 is erected on a ground 30. At the front of the nacelle 12, a hub 13 is attached. Three blades 14.1, 14.2, 14.3 are attached to the hub 13 for rotation therewith. However, the number of blades 14 may be amended as needed. For example, two or more than three blades 14 may be used in the wind turbine 10.

Each of the blades 14.1, 14.2, 14.3 comprises a down conductor 15.1, 15.2, 15.3 inside of the respective blade 14.1, 14.2, 14.3. The down conductors 15.1, 15.2, 15.3 are provided as part of a lightning protection system for conducting electrical impulse injected from a lightning strike via the hub 13, the nacelle 12 and the tower 11 to the ground 30. For this purpose, the hub 13, the nacelle 12 and the tower 11 may comprise further down conductors not shown in FIG. 1. Also, or alternatively, the tower 11 itself may act, i.e., be used, as a down conductor.

At each of the down conductors 15.1, 15.2, 15.3 and the tower 11 a measurement point 16.1, 16.2, 16.3, 16.4 of a lightning detection system is provided. These measurement points 16.1, 16.2, 16.3, 16.4 may be provided with a Rogowski coils wrapping the down conductors 15.1, 15.2, 15.3 and the tower 11 and an ohmmeter to measure electrical impulse or electrical energy flowing inside the down conductors 15.1, 15.2, 15.3 and the tower 11.

The unmanned aerial vehicle 20 is provided as a quadcopter in this embodiment but may be of any other type of unmanned aerial vehicle 20. An electrical impulse generator 21 is attached to the unmanned aerial vehicle 20. Further, a camera 23 is attached to the unmanned aerial vehicle 20. The electrical impulse generator 21 is maneuvered in range to the blade 14.1 of the wind turbine 10 such that the electrical impulse generator 21 is able to discharge electrical impulse impacting the blade 14.1 of the wind turbine 10.

The blade 14.1 of the wind turbine 10 is at a position of 12 o clock. From this position, the electrical impulse generator 21 discharges an electrical impulse via a wired electrode 25 fired at the blade 14.1 and impacting the blade 14.1. The electrode 25 sticks to the blade 14.1 due to the electrical impulse being discharged to the blade 14.1, i.e., it's down conductor 15.1. The electrode 25 is connected to electrical impulse generator 21 by a wire 24 limiting the range of the electrical impulse generator 21 at which it is able to discharge electrical impulse at the wind turbine 10. The discharged electrical impulse flows as impacting electrical impulse or electrical energy through the down conductors 15 of the lightning protection system of the wind turbine 10. From the down conductor 15.1 of the blade 14.1, the impacting electrical impulse or electrical energy flows via the down conductors (not shown) in the hub 13, nacelle 12 and via the tower 11 to the ground 30.

The impacting electrical impulse or electrical energy is measured at the measurement point 16.1 of the blade 15.1 and the measurement point 16.4 of the tower 11. Since the discharged electrical impulse is predetermined, i.e., its duration and magnitude are known, it may be compared to the impacting electrical impulse measured at the measurement point 16.1 of the blade 15.1 and the measurement point 16.4 of the tower 11.

A first interface 22 of the unmanned aerial vehicle 20 wirelessly transmits information, i.e., duration and magnitude, of the discharged electrical impulse or electrical energy to an analysis unit 17 located at the wind turbine 10. The analysis unit 17 further receives the information about the impacting electrical impulse or electrical energy measured at the measurement point 16.1 of the blade 15.1 and the measurement point 16.4 of the tower 11 and then compares the discharged electrical impulse and the impacting electrical impulse or electrical energy. If the analysis unit 17 finds that the impacting electrical impulse or electrical energy is conducted down to the measurement point 16.4 of the tower 11, but that the electrical impulse or electrical energy does not match in either of the measurement point 16.1 of the blade 15.1 and the measurement point 16.4 of the tower 11, it may judge that the lightning detection system does not properly work, i.e. one of the measurement points 16.1, 16.4 did not deliver accurate measurements, and give an alarm or warning.

If, however, no impacting electrical impulse or electrical energy is measured at the measurement point 16.4 of the tower 11, it may be judged that the lightning protection system does not work properly. This might mean, that the impacting electrical impulse or electrical energy has caused damage to the wind turbine 10 and thus the wind turbine 10 may be inspected by the unmanned aerial vehicle 20 and its camera 23, for example, to find a damaged spot and thereby the location of the malfunction of the lightning protection system.

Although the present invention has been disclosed in the form of embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method for testing a lightning protection system and/or a lightning detection system of a wind turbine, the method comprising usage of an unmanned aerial vehicle comprising an electrical impulse generator capable of simulating a lightning strike by discharging an electrical impulse, the method comprising:

(a) maneuvering the unmanned aerial vehicle in range of the wind turbine such that the electrical impulse generator of the unmanned aerial vehicle is able to discharge the electrical impulse to impact the wind turbine, wherein the electrical impulse generator comprises at least one electrode that is discharged as a projectile from the unmanned aerial vehicle to close a gap between the electrical impulse generator and the wind turbine, the at least one electrode sticking to the wind turbine, whereby the at least one electrode is electrically connected to the electrical impulse generator by a wire after closing the gap for discharging the electrical impulse via the wire and the at least one electrode; and (b) discharging the electrical impulse by the electrical impulse generator such that the discharged electrical impulse impacts the wind turbine as an impacting electrical impulse, wherein, during the discharging, the unmanned aerial vehicle is physically connected to the wind turbine via the wire and the at least one electrode, the wire spanning the gap between the electrical impulse generator and the wind turbine.

2. The method according to claim 1, wherein the unmanned aerial vehicle comprises a camera for inspecting the wind turbine for damages.

3. The method according to claim 1, wherein the lightning detection system comprises at least one detection point at which the lightning detection system detects the impacting electrical impulse.

4. The method according to claim 3, wherein the at least one detection point of the lightning detection system is located inside of a blade of the wind turbine, inside of a hub of the wind turbine, inside a nacelle of the wind turbine and/or at a tower of the wind turbine.

5. The method according to claim 4, further comprising: determining, when the impacting electrical impulse is not detected by the lightning detection system at the at least one detection point at the tower of the wind turbine after the discharged electrical impulse has impacted the wind turbine, that the lightning protection system has a malfunction.

6. The method according to claim 4, wherein the at least one detection point is a measurement point for measuring the impacting electrical impulse.

7. The method according to claim 6, wherein the at least one measurement point is formed by or comprises a Rogowski coil.

8. The method according to claim 6, wherein the method further comprising:

(a) measuring the impacting electrical impulse at the at least one measurement point, and (b) comparing the impacting electrical impulse with the discharged electrical impulse.

9. The method according to claim 8, wherein the unmanned aerial vehicle comprises a first interface connected or connectable to an analysis unit and the lightning detection system comprises a second interface connected or connectable to the analysis unit, whereby the analysis unit is arranged for comparing the impacting electrical impulse with the discharged electrical impulse.

10. The method according to claim 8, wherein the duration and/or magnitude of the discharged electrical impulse is predetermined, the duration and/or magnitude of the impacting electrical impulse is measured at the at least one measurement point and the duration and/or magnitude of the discharged electrical impulse and the impacting electrical impulse are compared.

11. The method according to claim 8, further comprising: determining, when the impacting electrical impulse is detected at a measurement point of the at least one measurement point at a tower of the wind turbine and the discharged electrical impulse and the measured impacting electrical impulse are different from one another in at least one of the at least one measurement points, that the lightning detection system has a malfunction.

12. The method according to claim 1, wherein the electrical impulse is discharged by the electrical impulse generator on a blade of the wind turbine.

13. The method according to claim 1, wherein the discharging of the electrical impulse by the electrical impulse generator is performed several times and at different positions and/or blades of the wind turbine.

14. The method according to claim 1, wherein the discharging of the electrical impulse by the electrical impulse generator is performed several times at different form, duration and/or magnitude of the discharged electrical impulse.

* * * * *